United States Patent
Miyashita et al.

[11] Patent Number: 6,098,638
[45] Date of Patent: *Aug. 8, 2000

[54] METHOD OF MANUFACTURING A SEMICONDUCTOR DEVICE AND AN APPARATUS FOR MANUFACTURING THE SAME

[75] Inventors: Naoto Miyashita, Yokohama; Jun Takayasu, Kawasaki; Mariko Shimomura, Yokohama, all of Japan

[73] Assignee: Kabushiki Kaisha Toshiba, Kawasaki, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/780,185

[22] Filed: Dec. 26, 1996

[30] Foreign Application Priority Data

Dec. 27, 1995 [JP] Japan .................................... 7-351302

[51] Int. Cl.[7] .................................. B08B 6/00; B44C 1/22
[52] U.S. Cl. .................................. 134/1.3; 216/89; 216/38
[58] Field of Search .............................. 134/1.3; 216/89, 216/38; 156/345

[56] References Cited

U.S. PATENT DOCUMENTS

| | | | |
|---|---|---|---|
| 4,184,908 | 1/1980 | Lackner et al. | 156/636 |
| 5,078,801 | 1/1992 | Malik | 134/29 |
| 5,320,706 | 6/1994 | Blackwell | 156/636 |
| 5,571,373 | 11/1996 | Krishna et al. | 156/636.1 |
| 5,578,193 | 11/1996 | Aoki et al. | 205/746 |
| 5,578,529 | 11/1996 | Mullins | 437/228 |
| 5,605,487 | 2/1997 | Hileman et al. | 451/5 |
| 5,626,509 | 5/1997 | Hayashi | 451/285 |
| 5,643,406 | 7/1997 | Shimomura et al. | 156/636.1 |
| 5,645,737 | 7/1997 | Robinson et al. | 216/99 |
| 5,711,818 | 1/1998 | Jain | 134/6 |

FOREIGN PATENT DOCUMENTS

| | | |
|---|---|---|
| 637619 | 2/1995 | European Pat. Off. . |
| 4-206724 | 7/1992 | Japan . |
| 7-321082 | 12/1995 | Japan . |
| 1042968 | 9/1983 | Russian Federation . |

OTHER PUBLICATIONS

"Novel Electrolysis—Inonized—Water Cleaning Technique For The Chemical–Mechanical Polishing (CMP) Process"; Aoki et al; 1994; abstract only; 1994 Symposium on VLSI Tech. Digest of Tech. Papers.

N. Miyashita et al., "A New Post CMP Cleaning Method For Trench Isolation Process", Chemical–Mechanical–Polishing (CMP–MIC 96), p. 161.

"Postchemical–Mechanical Planarization Cleanup Process for Interlayer Dielectric Films"; Roy et. al.; pp. 216–225; Jan. 1995; Roy et. al.; J. Elect. Soc.; vol. 142 (1).

*Primary Examiner*—William Powell
*Assistant Examiner*—George Goudreau
*Attorney, Agent, or Firm*—Finnegan, Henderson, Farabow, Garrett & Dunner, L.L.P.

[57] ABSTRACT

In a CMP process for flatting a surface of a film on a semiconductor wafer, ionized water is used as rinsing liquid in the post-polishing step performed after the main CMP polishing step. With ionized water as rinsing liquid, abrasive particles adhered to the film surface during the main polishing step are removed.

12 Claims, 5 Drawing Sheets

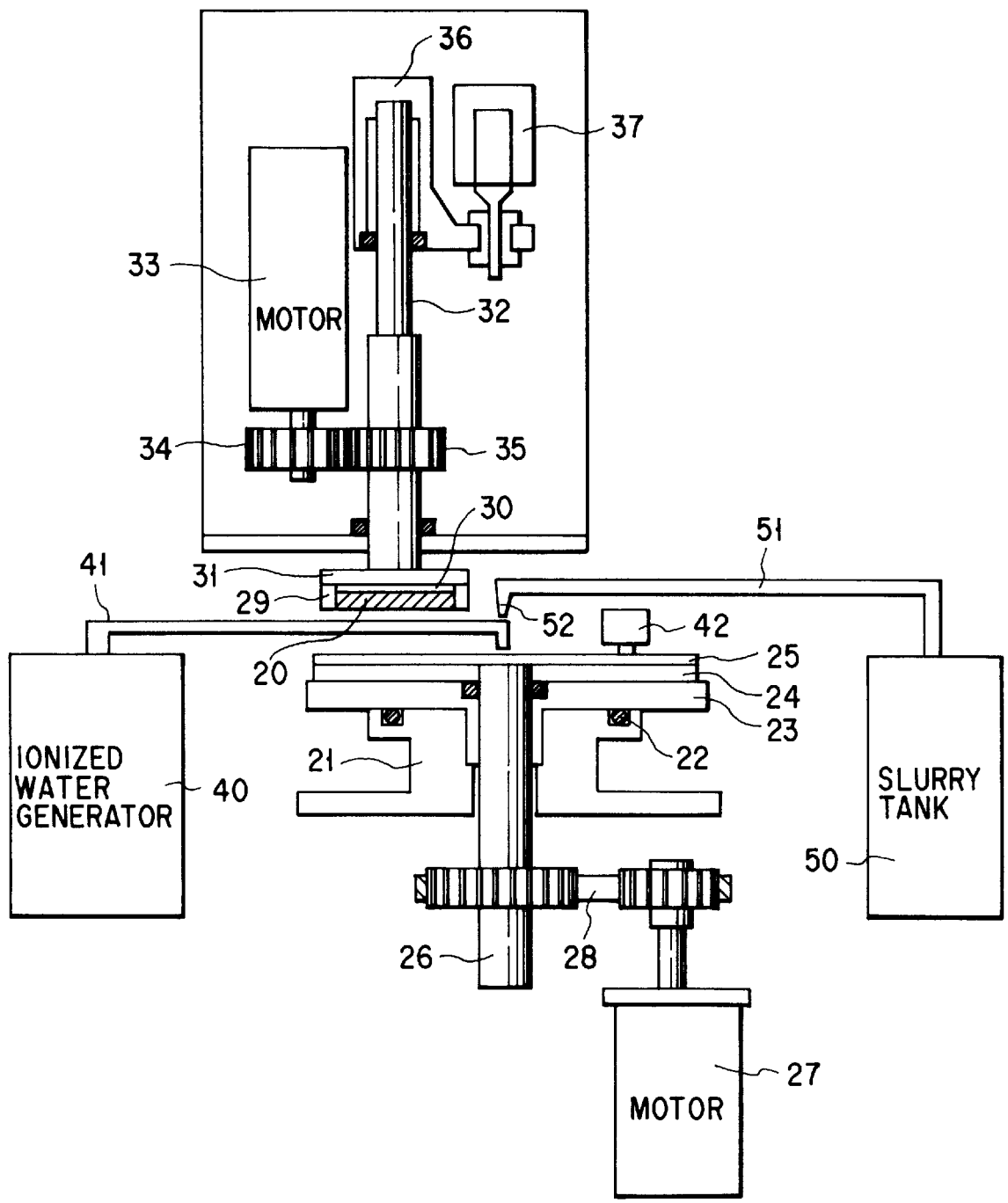
F I G. 1

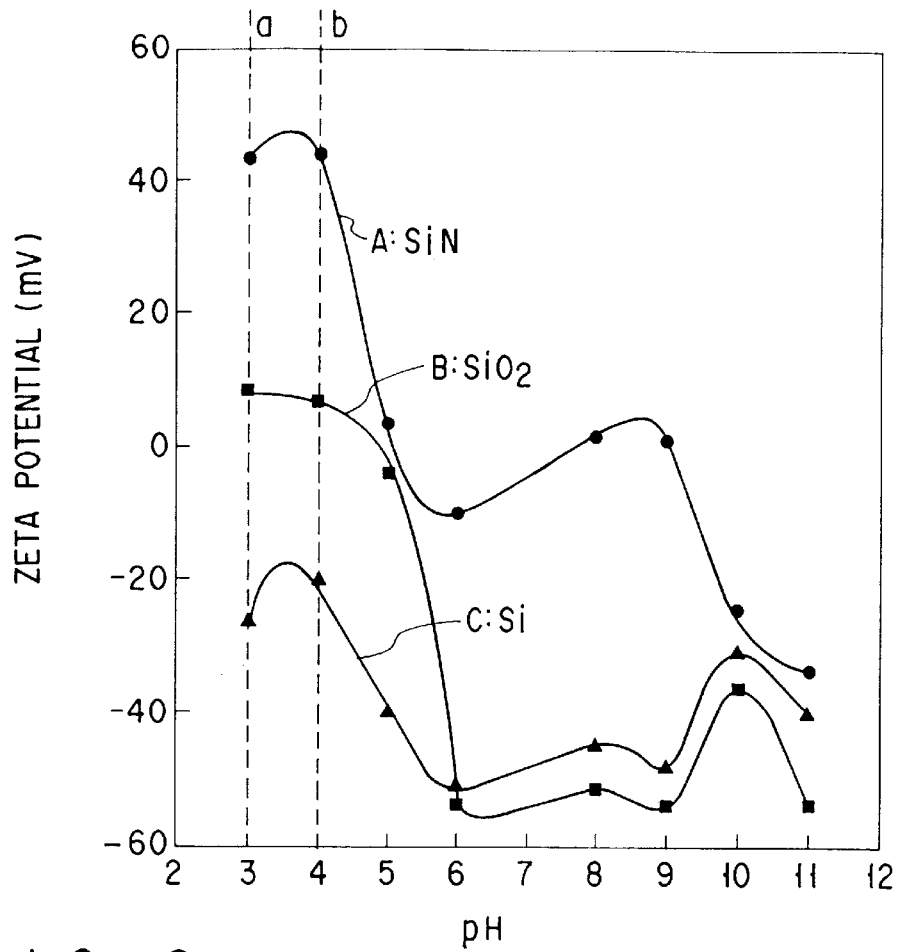
FIG. 2
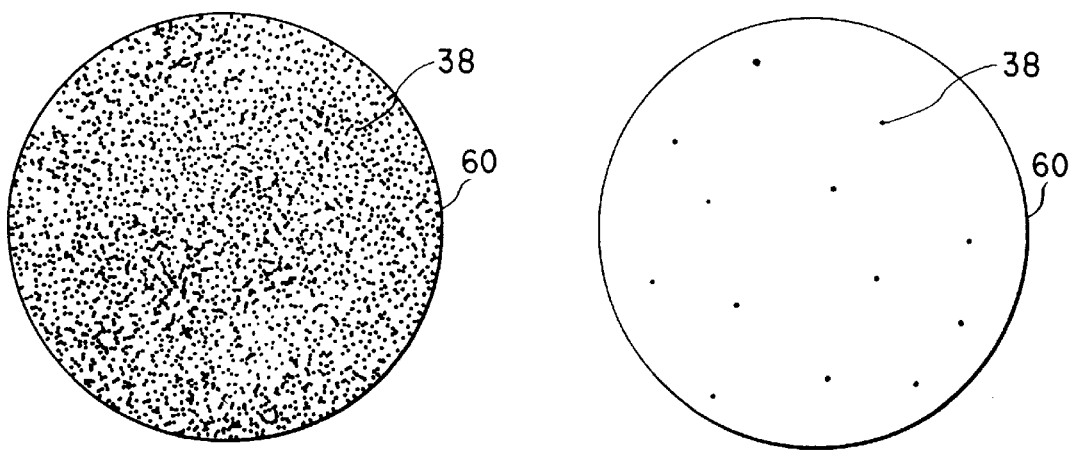
FIG. 3A
PRIOR ART
FIG. 3B

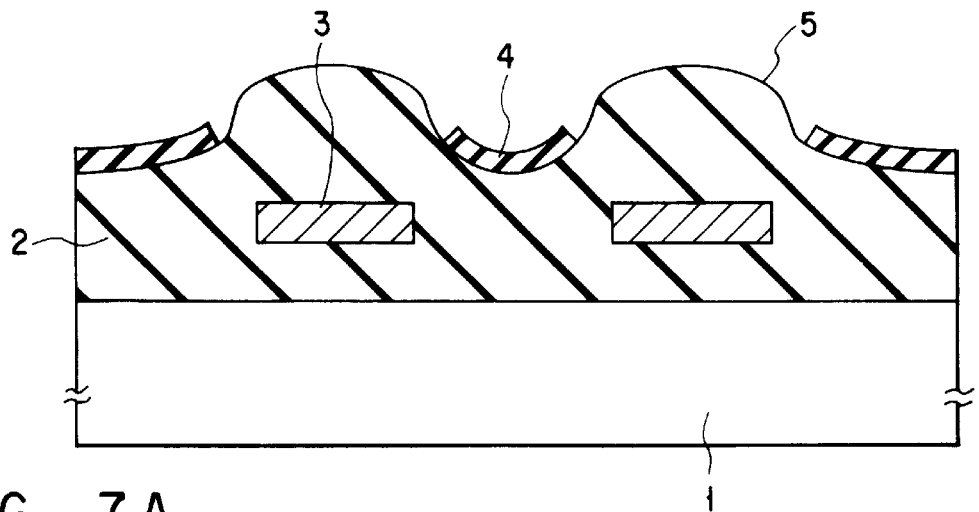
F I G. 7A
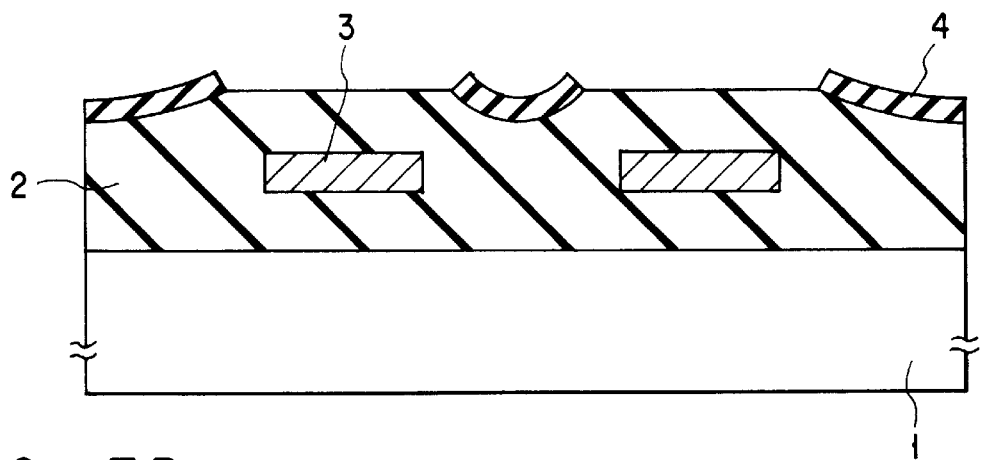
F I G. 7B
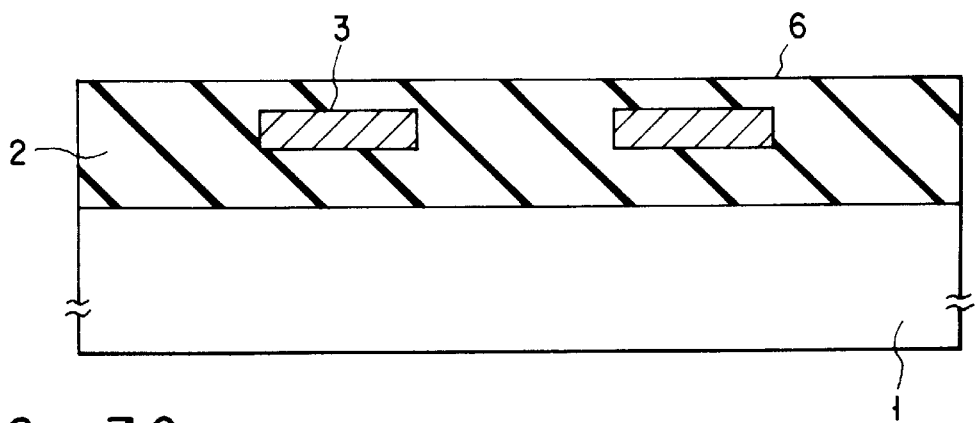
F I G. 7C

METHOD OF MANUFACTURING A SEMICONDUCTOR DEVICE AND AN APPARATUS FOR MANUFACTURING THE SAME

BACKGROUND OF THE INVENTION

This invention relates to a method of manufacturing a semiconductor device and an apparatus for polishing a semiconductor substrate or a film on a semiconductor substrate to planarize the surface of the film.

In the conventional process of forming a semiconductor device such as IC and LSI, a film made of material such as metal, polysilicon or silicon dioxide is formed over the surface of the semiconductor substrate, i.e., semiconductor wafer in which grooves (e.g. trenches, contact holes) are formed, so that the grooves are fully filled with the film material. Subsequently, the surface of the film is planarized. As a method of planarizing the surface of the film, etchback RIE (Reactive Ion Etching) is known.

The etchback RIE, however, requires an additional step of providing etchback photoresist on the surface of the film. This increases the number of the steps of manufacturing the semiconductor device. Furthermore, during the etchback RIE process, the surface of the film may be damaged and, thus, good planarization cannot be easily attained. Moreover, to perform the etchback RIE, a vacuum type apparatus complicated in structure is used. The manufacturing efficiency of the semiconductor device is thus inevitably low. Additionally, it is necessary to use dangerous gas to perform the etchback RIE. The planarization using the etchback RIE has thus various disadvantages.

In view of this, CMP (Chemical Mechanical Polishing) which can be performed by a polishing machine is recently put into practice, instead of the etchback RIE.

The polishing machine used for the CMP process comprising a polishing pad and a wafer holder. The polishing pad is applied with a polishing cloth on the surface thereof and rotated by a motor or the like, and the wafer holder rotatably holds a semiconductor substrate, pressing the substrate against the polishing pad. Generally, when the surface of the film on the substrate is planarized by use of the polishing machine, the substrate is rotated while pressed against the polishing cloth on the rotating polishing pad. The film is thereby polished while slurry supplied on the polishing cloth. The slurry contains as abrasive particles of material such as ceria (cerium oxide), silica (silicon oxide), and silicon nitride ($Si_3N_4$). Silicon nitride particles are described in Jpn. Pat. KOKAI Appln. No. 7-317054. When a stopper film is made of silicon nitride and the slurry contains silicon nitride as the abrasive particles, a high etching ratio of the film to be planarized to the stopper film is achieved.

In the conventional polishing process of a semiconductor substrate with use of the CMP polishing machine, the film to be polished (e.g., an oxide film) is polished with the supplied slurry until the thickness of the film decreases to a predetermined value. When the film is planarized to a desired degree, the polishing is stopped. Subsequently, post-polishing is performed while supplying water instead of the slurry in order to remove the foreign articles (abrasive particles, in particular) adhered to the film surface during the main polishing. The post-polishing is performed by supplying pure water or ultra-pure water onto the wafer. Thus, it is called as "DI water-rinsing" or "water-rinsing". The post-polishing process is followed by the cleaning step of cleaning the surface of the film.

If the zeta potential on the surfaces of the particles is opposite in polarity to that on the surface of the polished film, the particles strongly adhere to the surface of the polished film, zeta potential meaning the electric potential existing across the interface of solids and liquids. It is therefore difficult in such cases to remove the particles from the film surface by the conventional post-polishing technique described above. The zeta potential on the surface of the particles adhered to the surface of the silicon semiconductor substrate or the surface of the polished film has a positive or negative polarity. The zeta potential depends on the pH on the surface of the material, as is shown in FIG. 2. In FIG. 2, the zeta potential (mV) on the surface of the material is protted on the ordinate, and the pH on the surface of the material on the abscissa. Curve A shows the zeta potential characteristic of silicon nitride, curve B the zeta potential characteristic of silicon oxide, and curve C shows the zeta potential characteristic of silicon.

In a general polishing machine for performing the CMP process, a slurry most suitable for polishing the material of the film to be polished is used. The films to be polished have different zeta potentials according to the material of the films to be polished. Also, the abrasive particles have different zeta potentials according to the material of the abrasive particles. The adhesion of the particles to the polished film therefore varies in accordance with their zeta potentials. Further, the zeta potential depends on the pH on the material, and thus the number of the particles adhered to the film surface varies in accordance with the pH on the material.

BRIEF SUMMARY OF THE INVENTION

The present invention has been developed in consideration of the above, and has its object to provide a method of manufacturing a semiconductor device wherein an effective post-polishing in the CMP polishing process on a semiconductor substrate or a film provided on a semiconductor substrate can be realized. Another object of the invention is to provide an apparatus of manufacturing a semiconductor device, in which the post-polishing process is performed.

The semiconductor device manufacturing method according to an aspect of the present invention comprises the steps of: polishing the surface of the film provided on a semiconductor substrate with a polishing cloth while supplying slurry onto the surface of the film; polishing the film until the film comes to have a predetermined thickness and stopping the supply of the slurry when the polishing has finished; and causing a zeta potentials on abrasive particles which are contained in the slurry and adhered to the surface of the film and a zeta potential on the polished film to have the same polarity.

The semiconductor device manufacturing method according to another aspect of the present invention comprises the steps of: polishing a surface a semiconductor substrate with use of a polishing cloth by supplying slurry onto the surface of the semiconductor substrate; polishing the surface of the semiconductor substrate until the film comes to have a predetermined thickness and stopping the supply of the slurry when the polishing has finished; and causing a zeta potential on abrasive particles which are contained in the slurry and adhered to the surface of semiconductor substrate and a zeta potential of the polished film to have the same polarity.

The semiconductor device manufacturing apparatus according to further aspect of the present invention comprises: a polishing pad on a surface of which a polishing cloth is mounted; a holder for holding a substrate to be polished; rotating means for rotating at least one of the polishing pad and the holder; supplying means for supplying slurry onto the polishing cloth; and supplying means for supplying ionized water to the polishing cloth.

The step of causing the zeta potential on abrasive particles which are contained in the slurry and adhered to the surface of the film and that of the zeta potential on the polished film to have the same polarity may be a step of performing the post-polishing while supplying to the polishing cloth ionized water having a predetermine pH in place of supplying pure water or ultra-pure water, or a step of performing the post-polishing while supplying to the polishing cloth surface active agent in place of supplying pure water or ultra-pure water, or a step of performing the post-polishing while supplying to the polishing cloth a mixture of surface active agent and liquid such as pure water and ultrapure water, in place of supplying only pure water or ultra-pure water.

In the post-polishing performed after the main polishing, ionized water having a predetermined pH is supplied to the polishing cloth so that the polarity of the zeta potential on the film becomes the same as that of the zeta potential on the abrasive particles contained in the slurry, to thereby easily remove the particles adhered to the film surface therefrom. To increase the ease of the removal of the particle, it is preferable to supply the ionized water so that the absolute values of the zeta potentials on the film and particles are close to each other. In this manner, the adhesion of the abrasive particles to the film surface is prevented.

In the post-polishing process, if the ionized water may be replaced with the surface active agent or the mixture of the surface active agent and water (such as pure water and ultra-pure water), the zeta potential on the abrasive particles (curve A of FIG. 6) decreases as shown by curve A'. As a result of the decrease, the ranges of the pHs on the film and the abrasive particles expand, in which the zeta potentials on the film and the particle have the same polarity. In this curve, the pH range in which the absolute values of the zeta potentials on the film and the particles are close to each other also expands. The abrasive particles adhered to the film on the semiconductor substrate can therefore be effectively removed.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a sectional view of the apparatus of manufacturing a semiconductor device according to an embodiment of the present invention.

FIG. 2 is a characteristic curve showing the dependency of the zeta potentials on materials regarding the pH on the material.

FIG. 3A is a top view of the surface of the film on the semiconductor wafer subjected to the post-polishing process according to the conventional method, which shows the remains of the abrasive particles on the film surface.

FIG. 3B is a top view of the surface of the film on the semiconductor wafer subjected to the post-polishing process according to the present invention, which shows the remains of the abrasive particles on the film surface.

FIG. 7A shows a sectional view of the semiconductor device for explaining a step of the semiconductor substrate planarization method according to the present invention.

FIG. 7B shows a sectional view of the semiconductor device for explaining a step of the semiconductor substrate planarization method according to the present invention.

FIG. 7C shows a sectional view of the semiconductor device for explaining a step of the semiconductor substrate planarization method according to the present invention.

DETAILED DESCRIPTION OF THE INVENTION

Figure 4:
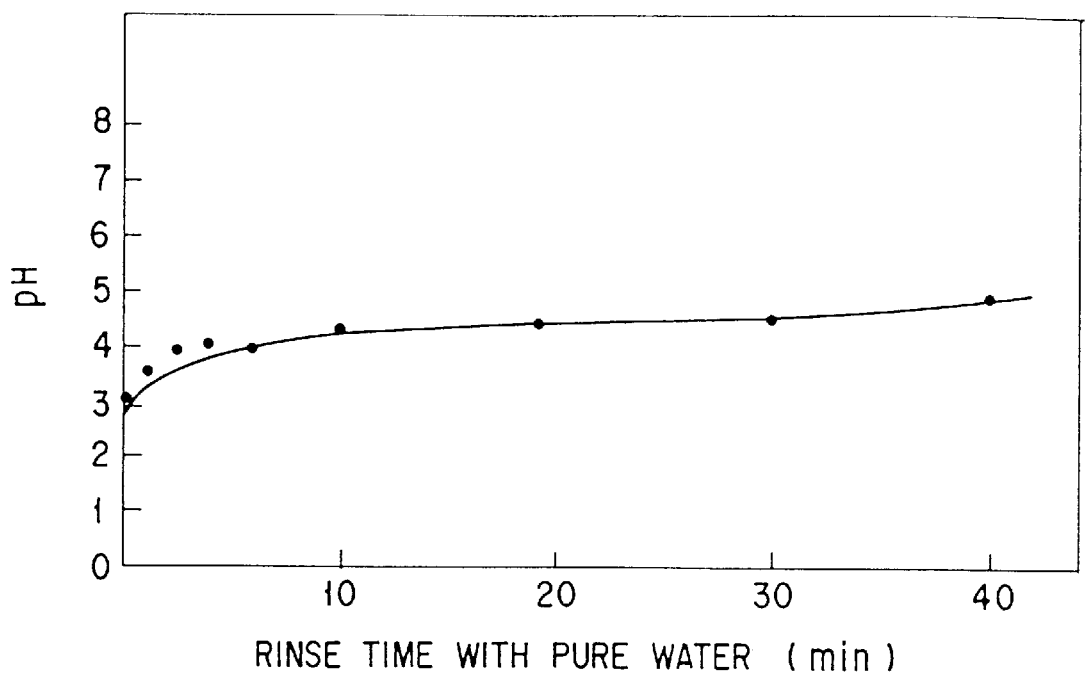
FIG. 4 is a characteristic curve of pH versus rinse time with pure water, which shows the change of the pH according to the lapse of the rinse time with use of pure water in the post-polishing process of the conventional method.

The embodiment of this invention will be described below in conjunction with the accompanying drawings.

At first, a semiconductor device manufacturing apparatus for performing the semiconductor device manufacturing method according to the present invention, i.e., a polishing machine for performing the CMP will be described with reference to FIG. 1. FIG. 1 is a sectional view of the semiconductor device manufacturing apparatus. FIG. 1 shows that a polishing pad support 23 is fixed on a stage 21 by means of a bearing 22. The polishing pad support 23 holds a polishing pad 24, and the polishing pad 24 is applied with a polishing cloth 25 for polishing a wafer (a semiconductor substrate) 20. In the center of the above-mentioned structure, a driving shaft 26 is provided for rotating the polishing pad support 23 and the polishing pad 24. The driving shaft 26 is driven by a motor 27 through a driving belt 28. The wafer 20 is located to face the polishing cloth 25 and sucked by vacuum or the surface tension of water to a sucking cloth 30 and a template 29 which are applied to a wafer hold 31.

The wafer hold 31 is fixed to the driving shaft 32 so as to be rotated by the driving shaft 32. The driving shaft 32 is rotated by the motor 33 via the gears 34 and 35, and supported by a driving shaft supporting member 36. The supporting member 36 is also fixed to a cylinder 37, and moves up and down in accordance with the vertical movement of the cylinder 37. When the driving shaft supporting member 36 is located in the upper position, slurry is supplied between the wafer 20 held by the wafer hold 31 and the polishing cloth 25. After the slurry is supplied, the driving shaft supporting member 36 is descended to make the wafer 20 contact to the polishing cloth 25. In this manner, the friction is generated between the wafer 20 and the polishing cloth 25 by the rotations of the wafer hold 31 and the driving shaft supporting member 36, thereby the film (not shown in FIG. 1) on the wafer 20 is polished. The film is shown in FIGS. 3A and 3B with reference numeral 60.

In this structure of the polishing machine, the driving shaft supporting member 36 moves up and down in accordance with the vertical movement of the cylinder 37. Before the slurry is supplied, the driving shaft supporting member 36 is ascended. When the driving shaft supporting member 36 is ascended, the slurry selected according to the material of the film to be polished is supplied onto the polishing cloth 25 to flow between the wafer 20 held by the wafer hold 31 and the polishing cloth 25. The polishing is performed by pressing the wafer 20 onto the polishing pad 24 rotating at a speed of 100 rpm, for example. The rotation speed of the polishing pad 24 is set at a range such as 20–200 rpm, and the pressure exerted on the wafer 20 is set at 50–500 g/cm$^2$.

In the present invention, a slurry supplying nozzle 52 coupled with a pipe 51 connected with a slurry tank 50 is provided as the means for supplying the slurry onto the polishing cloth 25, similarly to the conventional method. The present invention further provides an ionized water supplying pipe 41 above the polishing cloth 25, and a pH meter 42 contacting to the polishing cloth 25. The ionized water supplying pipe 41 is connected with the electrolytic ionized water generator 40. The ionized water generated by the generator 40 is supplied onto the polishing cloth 25 through the ionized water supplying pipe 41. A pump (not shown) is provided to suck up ionized water from the ionized water generator 40. Similarly, a pump (not shown) is provided to suck up slurry from the slurry tank 50.

According to one of the CMP methods of the present invention, the ionized water is used for the post-polishing. The post-polishing using the ionized water is called as ionized-water rinsing.

In the above-mentioned embodiment, the numbers of the electrolytic ionized water generator 40 and the ionized water supplying pipe 41 provided to the machine are respectively one. However, a plurality of electrolytic ionized water generators which generate different types of ionized water having different pHs, and a plurality of ionized water supplying pipes corresponding to the plurality of electrolytic ionized water generators may be provided to the machine. In this case, selection means need to be provided to select one of the ionized water supplying pipes.

With this structure, the ionized water of the pH selected in accordance with the material of the film to be polished can be supplied. More specifically, the ionized water of the desired pH is supplied by selecting one of the ionized water supplying pipes connected to one of the electrolytic ionized water generators which generates the ionized water of the pH selected in accordance with the material of the film to be polished.

In addition, the machine may be provided with one ionized water supplying pipe and a plurality of electrolytic ionized water generators. Also in this case, the ionized water having the pH selected in accordance with the material of the film to be polished can be supplied. More specifically, the ionized water of the desired pH can be supplied by connecting the one ionized water supplying pipe to one of the electrolytic ionized water generators which generates the ionized water of the pH suitable for the material of the film to be polished.

Next, the semiconductor device manufacturing method shown in FIGS. 2–5, i.e., the planarization process by polishing the film formed on the semiconductor substrate, will be described below. The slurry used for this process contains silicon nitride as abrasive particles. The suitable viscosity of the slurry containing the silicon nitride particles is 1–10 cp. With use of the slurry having this range of viscosity, high polishing rate of 0.5–1.0 μm/min. can be attained. In addition, when the silicon nitride, the material of the slurry particles, is also used to form the stopper film on the semiconductor substrate, the etching ratio of the film to be polished to the stopper film is remarkably increased. The particle diameter of the silicon nitride is desired to be ranged 0.01–100 nm in the primary particle, more preferably, 10–40 nm. The particles are suitable to be formed within the range of 60–100 nm in the secondary particle in a colloidal state. The silicon nitride film has been conventionally used in the manufacturing of a semiconductor device, and thus the slurry can be used with no difficulty. With use of slurry having such particles, uniform removal rate can be attained.

However, as shown in FIG. 2 showing the pH dependency of the zeta potential, the polarity of the zeta potential on silicon nitride (shown by curve A) is opposite in a wide pH range to those of the zeta potentials on silicon oxide (shown by curve B) and silicon (shown by curve C). Further, the zeta potential on silicon nitride is ranged at an area greatly different from that of the silicon oxide and silicon. Therefore, if silicon oxide film or silicon film is polished with use of the slurry containing silicon nitride particles as abrasive particles, the silicon nitride particles may be easily adhered to the silicon oxide or silicon film. FIG. 3A shows the condition of the surface of the film subjected to the conventional post-polishing process, i.e., the rinsing process with use of water after the film is polished with use of the slurry containing silicon nitride particles. FIG. 3B shows the condition of the surface of the film subjected to the post-polishing process according to the present invention, i.e., the rinsing process with use of ionized water after the film is polished with use of the slurry containing silicon nitride particles. As is clear from FIG. 3A and FIG. 3B, the number of particles 38 adhered to the surface of the film 60 subjected to the post-polishing process according to the present invention is remarkably smaller than that of the particles 38 adhered to the surface of the film 60 subjected to the conventional post-polishing process.

According to the semiconductor device manufacturing method of the present invention, the film surface on the semiconductor substrate is polished with use of the polishing cloth while supplying the slurry onto the polishing cloth, the supply of the slurry is stopped when the film is polished until the film comes to have a predetermined thickness, and then the post-polishing process is performed such that the zeta potential on the abrasive particles adhered to the film surface has the same polarity as that on the polished film.

FIG. 2 shows a characteristic curve showing the pH dependency of the zeta potential when the post-polishing process is performed by supplying ionized water. As shown in FIG. 2, in the post-polishing performed after the main polishing, the film is subjected to the post-polishing by supplying ionized water having a predetermined pH for a predetermined period of time such that the zeta potential on the film to be polished and that on the abrasive particles contained in the slurry have the same polarity, and such that the absolute values of these zeta potentials are close to each other. In this manner, the present invention attains the removal of the abrasive particles adhered to the film surface. The film on a semiconductor substrate (e.g. a silicon oxide film) is polished with use of the slurry containing silicon nitride particles as abrasive particles, at first, and then subjected to the post-polishing process by using the ionized water controlled to have a predetermined pH. As the slurry, an acid solvent of pH 3 (shown by line a) is used.

With use of the slurry containing silicon nitride particles, when the zeta potential on the abrasive particles adhered to the film surface has the same polarity as that on the polished film, repulsive force is exerted between the silicon nitride particles and the film. On the other hand, when these polarities are opposite to each other, the attraction force is exerted between the film and the particles. If the film to be polished is a silicon oxide film, the zeta potentials on the silicon nitride particles and silicon oxide film have the same polarity when the pH of the ionized water is around 5.2 and 10. In these pH regions, the absolute values of these zeta potentials are close to each other. The abrasive particles remove from the polished film in these pH regions. In consideration of this, the post-polishing process is performed while the pH of the ionized water supplied from the ionized water supplying pipe 41 (shown in FIG. 1) is measured with use of a pH meter 42, as described below more specifically.

Figure 5:
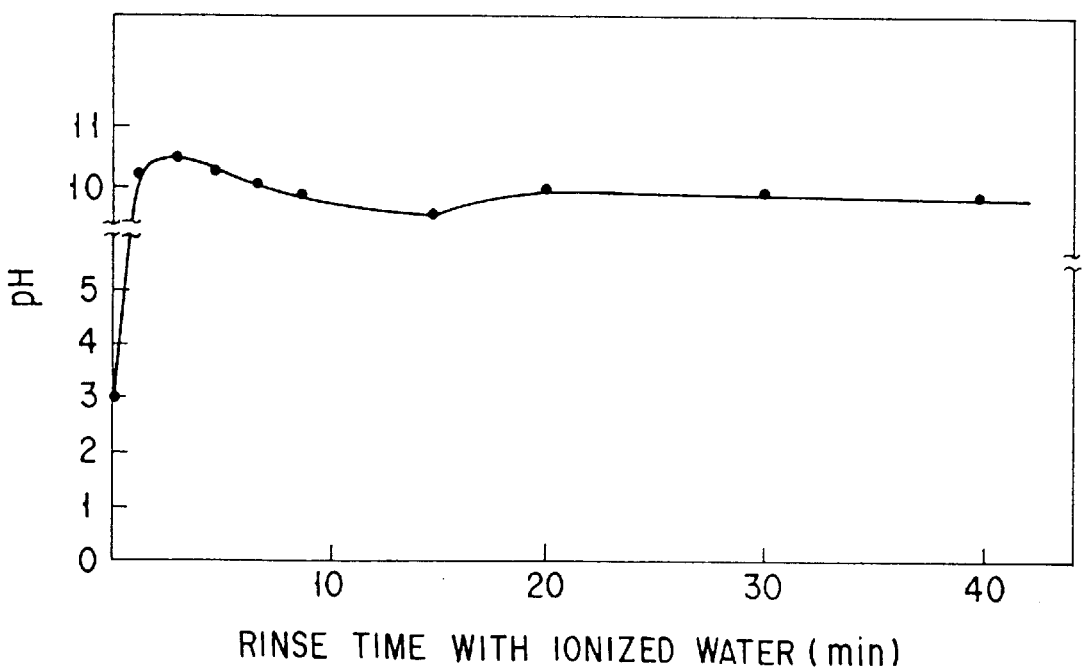
FIG. 5 is a characteristic curve of pH versus rise time with ionized water, which shows the change of the pH according to the lapse of the rinse time with use of ionized water in the post-polishing process according to an embodiment of the present invention.

After a predetermined main polishing has finished, the supply of the slurry is stopped, and then the post-polishing process (ionized water rinsing) is performed by supplying the ionized water of the pH selected from the above-mentioned regions (pH 11, for example). When the film is rinsed by supplying the ionized water to the abrasive cloth 25, the pH of the ionized water rinsing the film decreases at first by rinsing the film, but rapidly increases and recovers to pH 10 for not more than 1 minute, as shown in FIG. 5. If the ionized water rinsing is performed for a long period of time, the pH of the ionized water which rinses the film reaches pH 11. FIG. 5 is a characteristic curve showing the change of the pH of the ionized water rinsing the film per minute, which is measured by the pH meter 42 arranged to contact with the abrasive cloth 25. The ordinate shows the pH, and the abscissa shows rising time (minute) with shows ionized water. As shown in FIG. 3B, the number of the abrasive particles 38 is remarkably decreased after the ionized-water rinsing.

In contrast, when the water rinsing is performed according to the conventional method after the polishing is performed with use of the slurry of pH 3 in the similar manner to that of the above-described case, the pH of the water which rinses the abrasive cloth 25 gradually increases as the time has passed. However, as shown in FIG. 4, the pH is at most pH 4 even when more than 30 minutes has passed. The zeta potential on the silicon nitride at pH 4 (line b in FIG. 2) is notably high, approximately 43 mV. This value is too higher than the zeta potential on the film, i.e., about 8 mV, though these zeta potentials on the polished film (silicon oxide film) and the particles have the same polarity. In such a condition, the abrasive particles adhered to the film cannot be easily removed. FIG. 4 is a characteristic curve showing the change of the pH of the ionized water rinsing the film per minute, which is measured by the pH meter 42 arranged to contact with the abrasive cloth 25. The ordinate of the graph shows the pH, and the abscissa shows rise time (minute) with ionized water. As shown in FIG. 3A, innumerable particles 38 exist on the film after the water rinsing.

FIG. 2 shows a case where the polishing is performed with use of the slurry using the acid solvent and the post-polishing (ionized-water rinsing) is performed with use of the alkaline ionized water. The same effect can be obtained when the polishing is performed with use of the slurry using the alkaline solvent and the post-polishing (ionized-water rinsing) is performed with use of the acid ionized water.

Figure 6:
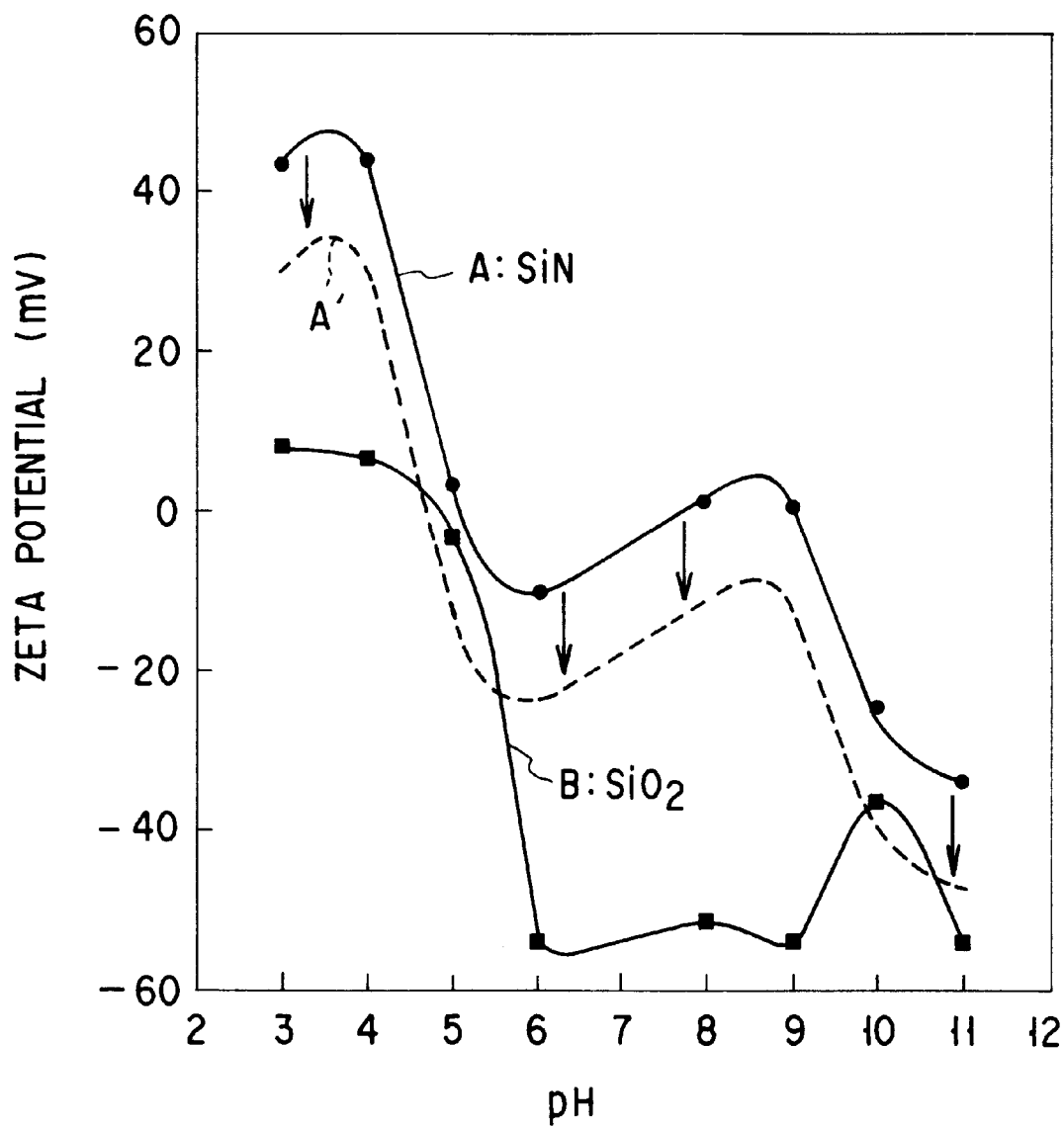
FIG. 6 is a characteristic curve showing the dependency of the zeta potential on the material.

FIG. 6 is a characteristic curve showing the pH dependency of the zeta potential when the post-polishing process is performed by supplying the surface active agent or the mixture of surface active agent and pure water or ultrapure water to the abrasive cloth. As shown in FIG. 6, the zeta potential on silicon nitride particles (curve A) decreases as shown by curve A'. As a result of the decrease, the ranges of the pHs on the film and the abrasive particles are expanded, in which the zeta potentials at the film and the particle become the same in the polarity. Further, the pH range where the absolute values of the zeta potentials on the film and the particles are close to each other is also expanded, and the abrasive particles adhered to the film on the semiconductor substrate can be effectively removed. The pH range wherein the abrasive particles are effectively prevented from adhering to the film surface on the semiconductor substrate is around 5 or 10. In this method, anionic surface active agent such as $C_{10}H_{21}OSO_3^-Na^+$ or $C_{14}H_{29}OC_2H_4OSO_3^-Na^+$ is used.

As one application of the semiconductor device manufacturing method of the present invention, the planarization method of the film to be polished on a semiconductor substrate will be described below in conjunction with FIGS. 7A–7C.

At first, polysilicon wires 3 are formed on a silicon semiconductor substrate 1, as a gate electrode or the like. A CVD oxide film 2 is deposited over the semiconductor substrate 1 so as to cover the polysilicon wires 3. In this time, the thickness of the portions of the CVD oxide film 2 which are formed on the polysilicon wires 3 is larger than that of the other portions, and are formed as protruded portions 5. In order to planarize the CVD oxide film 2, the CMP polishing process is performed on the surface of the semiconductor substrate 1, more specifically, the surface of the CVD oxide film 2 on the semiconductor substrate 1, with use of the polishing machine shown in FIG. 1, using a slurry containing silicon nitride, for example, as the adhesive agent. When the protruded portions 5 are large, the recess portions between each of the protruded portions are overpolished during the polishing. In order to prevent the overpolishing, stopper films 4 made of silicon nitride are formed on the recess portions between each of the protruded portions (see FIG. 7A). Subsequently, the semiconductor substrate is located on the polishing machine such that the surface of the semiconductor device (in this case, the surface of the CVD oxide film 2) is subjected to the CMP polishing process, as shown in FIG. 7B. Next, the stopper films 4 are etched to be removed from the CVD oxide film 2, thereby the planarized CVD oxide film 2 is obtained. By virtue of the stopper films 4, the CVD oxide film 2 is prevented from being overpolished and the surface thereof is flat (see FIG. 7C). Subsequently, the CVD oxide film 2 is rinsed with, for example, ionized water as the adhesive agent. As the result, the silicon nitride particles adhered to the surface of the CVD oxide film 2 are removed. Thus, wirings (not shown) of metal such as aluminum can be formed on the surface of the CVD oxide film 2 with sufficient reliability.

In the above embodiments, the cases where the abrasive particles attached on a film surface of the semiconductor substrate (semiconductor wafer) are removed, are described. However, the present invention is also applicable to a case where abrasive particles on a surface of a semiconductor substrate (semiconductor wafer) are to be removed.

When the CMP process according to the present invention is performed on the surface of the semiconductor substrate, the number of the abrasive particles adhered to the surface notably decreases. Further, according to the method of the present invention, the semiconductor substrate having a stably planarized surface can be obtained.

Additional advantages and modifications will readily occur to those skilled in the art. Therefore, the invention in its broader aspects is not limited to the specific details and representative embodiments shown and described herein.

Accordingly, various modifications may be made without departing from the spirit or scope of the general inventive concept as defined by the appended claims and their equivalents.

What is claimed is:

1. A method of manufacturing a semiconductor device consisting essentially of the steps of:

polishing a surface of a film on a semiconductor substrate with use of a polishing cloth by supplying a slurry onto the surface of the film;

polishing the surface of the film until the film comes to have a thickness and stopping the supply of the slurry when the polishing has finished; and causing a zeta potential on abrasive particles which are contained in the slurry and adhered to the surface of the film and a zeta potential of the polished film to have the same polarity, said causing step comprising a step of stopping the supply of the slurry, and a step of performing a post-polishing while supplying to the same polishing cloth used in the polishing step a mixture of a surface active agent and pure water.

2. The method according to claim 1, wherein said slurry contains silicon nitride as an abrasive material.

3. A method of manufacturing a semiconductor device consisting essentially of the steps of:

polishing a surface of a semiconductor substrate with use of a polishing cloth by supplying a slurry onto the surface of the semiconductor substrate;

polishing the surface of the semiconductor substrate until the semiconductor substrate comes to have a thickness and stopping the supply of the slurry when the polishing has finished; and causing a zeta potential on abrasive particles which are contained in the slurry and adhered to the surface of the semiconductor substrate and a zeta potential of the polished film to have the same polarity, said causing step comprising a step of stopping the supply of the slurry, and a step of performing a post-polishing while supplying to the same polishing cloth used in the polishing step a mixture of a surface active agent and pure water.

4. The method according to claim 3, wherein said slurry contains silicon nitride as an abrasive material.

5. A method of manufacturing a semiconductor device consisting essentially of the steps of:

polishing a surface of a film on a semiconductor substrate with use of a polishing cloth by supplying a slurry onto the surface of the film;

polishing the surface of the film until the film comes to have a thickness and stopping the supply of the slurry when the polishing has finished; and causing a zeta potential on abrasive particles which are contained in the slurry and adhered to the surface of the film and a zeta potential of the polished film to have the same polarity, said causing step comprising a step of stopping the supply of the slurry, and a step of performing a post-polishing while supplying to the same polishing cloth used in the polishing step ionized water having a pH.

6. The method according to claim 5, wherein said slurry contains silicon nitride as an abrasive material.

7. A method of manufacturing a semiconductor device consisting essentially of the steps of:

polishing a surface of a semiconductor substrate with use of a polishing cloth by supplying a slurry onto the surface of the semiconductor substrate;

polishing the surface of the semiconductor substrate until the semiconductor substrate comes to have a thickness and stopping the supply of the slurry when the polishing has finished; and causing a zeta potential on abrasive particles which are contained in the slurry and adhered to the surface of the semiconductor substrate and a zeta potential of the polished film to have the same polarity, said causing step comprising a step of stopping the supply of the slurry, and a step of performing a post-polishing while supplying to the same polishing cloth used in the polishing step ionized water having a pH.

8. The method according to claim 7, wherein said slurry contains silicon nitride as an abrasive material.

9. A method of manufacturing a semiconductor device consisting essentially of the steps of:

polishing a surface of a film on a semiconductor substrate with use of a polishing cloth by supplying a slurry onto the surface of the film;

polishing the surface of the film until the film comes to have a thickness and stopping the supply of the slurry when the polishing has finished; and causing a zeta potential on abrasive particles which are contained in the slurry and adhered to the surface of the film and a zeta potential of the polished film to have the same polarity, said causing step comprising a step of stopping the supply of the slurry, and a step of performing a post-polishing while supplying to the same polishing cloth used in the polishing step a mixture of a surface active agent and water.

10. The method according to claim 9, wherein said slurry contains silicon nitride as an abrasive material.

11. A method of manufacturing a semiconductor device consisting essentially of the steps of:

polishing a surface of a semiconductor substrate with use of a polishing cloth by supplying a slurry onto the surface of the semiconductor substrate;

polishing the surface of the semiconductor substrate until the semiconductor substrate comes to have a thickness and stopping the supply of the slurry when the polishing has finished; and causing a zeta potential on abrasive particles which are contained in the slurry and adhered to the surface of the semiconductor substrate and a zeta potential of the polished film to have the same polarity, said causing step comprising a step of stopping the supply of the slurry, and a step of performing a post-polishing while supplying to the same polishing cloth used in the polishing step a mixture of a surface active agent and water.

12. The method according to claim 11, wherein said slurry contains silicon nitride as an abrasive material.

* * * * *